United States Patent [19]

Saggese et al.

[11] 4,010,128
[45] Mar. 1, 1977

[54] FLEXIBLE PRINTING PLATE

[75] Inventors: Michael Frank Saggese, Nashville, Tenn.; Gerald Levine, Brooklyn; William E. Beckman, Hopewell Junction, both of N.Y.

[73] Assignee: Tenneco Chemicals, Inc., Saddle Brook, N.J.

[22] Filed: Apr. 2, 1975

[21] Appl. No.: 564,525

[52] U.S. Cl. .................. 260/23.7 M; 260/28.5 AV; 260/42.47; 260/42.52; 260/876 B; 428/908
[51] Int. Cl.² ......................................... C08L 91/00
[58] Field of Search ............. 101/337; 260/23.7 M, 260/27 EV, 897, 28.5 AV, 42.47, 42.52; 161/162, 184; 181/401.1; 204/159.15; 428/908

[56] References Cited

UNITED STATES PATENTS

| 3,201,498 | 8/1965 | Brunson | 260/897 |
| 3,238,086 | 3/1966 | Tompkins | 161/184 |
| 3,301,802 | 1/1967 | Myerss | 260/23.7 M |
| 3,630,980 | 12/1971 | Russell | 260/27 EV |
| 3,658,740 | 8/1972 | Marrs | 260/27 EV |

OTHER PUBLICATIONS

"Handbook of Adhesives", 1962, Skeist p. 223.

*Primary Examiner*—Donald E. Czaja
*Assistant Examiner*—William E. Parker
*Attorney, Agent, or Firm*—James P. Scullin

[57] ABSTRACT

Flexible printing plates of improved durability are obtained from a novel composition of matter comprising thermoplastic polymers and a lubricant. In a further embodiment, the composition can also include a particulate filler.

10 Claims, No Drawings

FLEXIBLE PRINTING PLATE

FIELD OF THE INVENTION

This invention relates to letterpress printing plates and, in particular to a new composition and method for making duplicate flexible thermoplastic printing plates of improved storage stability, abrasion resistance, resistance to ink solvents, uniformity, simplicity of procedure, and economy. The improved printing plates are particularly suitable for use on rotary presses.

BACKGROUND OF THE INVENTION

Duplicate press plates, rather than original printing material, are used for a number of reasons. By the use of duplicate plates, a printer can use more than one press on a given job at the same time. Also, duplicate plates can be readily and inexpensively shipped to different locations so that printing can be done simultaneously in different geographical locations. Through the use of duplicate plates, the original material is never subjected to press-wear. If a duplicate plate becomes worn or damaged, a new one can be prepared quickly and at low cost.

A wide variety of materials, both rigid and flexible, have been proposed and used for the making of duplicate printing plates. These materials include: metals such as lead, zinc, magnesium, and copper; thermosetting polymers such as epoxy resins, polyurethanes, and unsaturated polyesters; thermoplastic polymers such as plasticized polyvinyl chloride; and vulcanized rubber, both natural and synthetic. While each of these prior art materials has one or more advantages for a particular application in the printing industry, each also has some disadvantage in either an inherent property, in cost, or both. Consequently, there has been a continuing search for improved compositions for the making of duplicate printing plates, especially flexible printing plates for the letterpress printing industry.

Duplicate letterpress plates are used for printing such things as paper boxes and bags, labels, advertisements, books and catalogs, and newspapers and magazines. Plates made of hard materials such as metals and some of the thermosetting plastics give sharper printing impressions, and may be preferred for certain high quality work where cost and productivity are of secondary importance. They have a disadvantage in that they are not resilient and do not conform to irregularities in the printing couple: the area of a printing press where the ink is transferred from the plate to the paper or other substrate to be printed. Plates made of soft materials conform to printing couple irregularities, but do not give printing impressions as sharp as those from hard plates. Soft plates are often preferred for work in which quality is secondary to low cost and high productivity, such as advertisements and newspapers.

Higher and higher speed is a demand in the modern letterpress printing industry in order to increase productivity and lower costs. One means of accomplishing this objective is to shift from flat printing plates to curved plates and rotary presses. Making curved plates from rigid materials such as metals presents problems. It is difficult and costly to curve these materials to ensure conformity to the printing couple, and thus much makeready time is required. As a consequence, the industry has turned to flexible printing plates which are readily curved to fit the cylinders of rotary presses.

The predominant material used for the production of flexible and resilient printing plates has been rubber, either natural or synthetic, although there has also been some use of soft plastics such as plasticized polyvinyl chloride. Neither of these classes of materials has been completely satisfactory in regard to abrasion resistance, and each has other disadvantages. Rubber compositions require a vulcanization step once they have been molded against a matrix to form the desired impression. This requires time and the application of an elevated temperature under closely controlled conditions. In addition, the rubber composition in the unvulcanized state have only a limited storage life. At ordinary temperatures, the complex reactions involved in vulcanization begin to occur even though at a slow rate, until eventually the composition becomes cross-linked to such a degree that it cannot be molded against a matrix to produce an impression. For this reason, it is necessary to store the unvulcanized rubber compositions under refrigeration until they are molded into printing plates. Even under refrigeration, these unvulcanized compositions do not have an indefinite storage life. A further disadvantage is that vulcanized rubber compositions are subject to decomposition by exposure to oxygen or ozone. Thus even a finished rubber printing plate cannot be kept indefinitely for future use or re-use.

Resilient printing plates made from plasticized polyvinyl chloride do not require a vulcanization step, and do not require refrigerated storage. They are also superior to rubber printing plates in that they are essentially resistant to the degradative effects of oxygen and ozone. However, these materials have a serious drawback which has limited their acceptance to a considerable degree. The resilience and flexibility of these compositions is due to their plasticizer content. Plasticizers are also required to produce the flow properties needed for molding. The plasticizers normally used are extractable by the solvents used in printing inks, and by the solvents used for clean-up. Extraction of the plasticizer causes a change in the resiliency and flexibility of the printing plate, and also causes dimensional changes in the printing surface itself.

Printing plates of hard and soft vulcanized rubber are disclosed in U.S. Pat. No. 2,235,148 to Gartell. U.S. Pat. No. 2,558,269 to Reilly discloses a printing plate produced by laminating rigid polyvinyl chloride compositions. Flexible printing plates comprising plasticized, thermoset, polyvinylchloride are disclosed in U.S. Pat. No. 3,147,705 to Broderick et al, U.S. Pat. No. 3,217,642 to Tompkins et al., and U.S. Pat. No. 3,238,086 to Tompkins. Laminated printing plates which include a flexible plastic layer are disclosed in U.S. Pat. No. 3,338,163 to DeMaria, et al, U.S. Pat. No. 3,553,071 to Willett, and U.S. Pat. No. 3,597,293 to Willett. Flexible printing plates comprised of a magnetic powder and vulcanized rubber, thermoset plastics, or plasticized poly(vinylchloride) are disclosed in U.S. Pat. No. 3,217,641 to Goffredo. A dilatant plastic printing plate made from liquid plastics is disclosed in U.S. Pat. No. 3,269,308 to Goffredo. U.S. Pat. No. 3,798,035 to Varga et al discloses flexible printing plates from low molecular weight ethylene/vinyl acetate copolymers which are sensitive to and insolubilized by U.V. light. U.S. Pat. No. 3,408,437 to Wheeler et al discloses a process for forming printing plates by molding a variety of thermoplastics against a thermoplastic matrix.

SUMMARY OF THE INVENTION

It is the principal object of this invention to provide flexible duplicate printing plates with improved properties, and a composition and method for making them. These printing plates do not require vulcanization nor refrigerated storage, are substantially free from degradation due to oxygen or ozone, and do not contain extractable plasticizers. The compositions are prepared from readily available materials, using conventional equipment for compounding, mixing, and forming plastic materials. The finished molded plates are uniform in composition, dimensionally stable, abrasion resistant, and the printing surface is receptive to the inks conventionally used for printing.

The printing plates of this invention are very economical. They are prepared from low cost, readily available, materials and are easily formed using known and available compounding and molding equipment. There is a further and substantial economy, due to the fact that the compositions are thermoplastic, rather than being thermoset, as are vulcanized rubber and most of the prior art plastic materials which have been used for duplicate printing plates. Because of this thermoplasticity, any scrap and flash produced during the manufacture of the printing plates can be easily recycled into the process and re-used. In addition, the completed printing plates can also be recycled. Once a press has been completed and the printing plate is no longer needed, it can be simply re-molded against a different matrix to produce a fresh printing surface. Alternatively, the used printing plate can be recycled by blending it in with virgin material during the normal compounding and mixing cycle.

A further advantage of these novel printing plates is the fact that they can be produced in any desired color. The composition from which they are made is inherently low in color, so they they can be readily colored by the inclusion of small quantities of pigments or dyes. By this means, the plates can be color-coded for ready identification as to degree of flexibility, or as to subject matter contained on the printing surface.

We have found that certain thermoplastic polymeric materials can be formulated together with one or more lubricants and, optionally, with particulate fillers and also with modifiers such as impact modifiers, stabilizers, non-extractable plasticizers, and color pigments into compositions which are ideally suited for the manufacture of flexible printing plates.

In its broadest embodiment, the composition of this invention comprises a homogeneous mixture of at least one lubricant and three thermoplastic polymeric materials: a copolymer of an mono-olefin and a monoethylenically unsaturated ester; a thermoplastic rubber; and a random copolymer of 1,3-butadiene and acrylonitrile.

Although it is preferred to use a single olefin/ester copolymer, a single thermoplastic rubber, and a single butadiene-acrylonitrile copolymer in the practice of this invention, it is also possible to use mixtures of two or more of each type of polymer if desired.

The mono-olefin/ester copolymers useful in the practice of this invention are copolymers of an alpha-olefin having from 2 to about 6 carbon atoms such as ethylene, propylene, 1-butene, 2-methyl-1-pentene, and 1-hexene; and a monethylenically unsaturated ester having from 4 to about 12 carbon atoms such as vinyl acetate, vinyl propionate, vinyl 2-ethylhexoate, diethyl fumarate, dibutyl maleate, methyl acrylate, ethyl acrylate, methyl methacrylate, ethyl methacrylate, butyl acrylate, hexyl acrylate, octyl methacrylate, and 2-ethylhexyl acrylate, for example. We prefer copolymers of ethylene and ethyl acrylate. Examples of some suitable copolymers of alpha-olefins and monoethylenically unsaturated esters and methods for preparing them are disclosed in U.S. Pat. No. 2,200,429 to Perrin et al, U.S. Pat. No. 2,953,551 to White, U.S. Pat. No. 3,183,217 to Serniuk et al, U.S. Pat. No. 3,647,771 to Nakaguchi et al, and U.S. Pat. No. 3,793,262 to Logothetis.

The thermoplastic rubbers which can be used are block copolymers of mono-alkenyl aromatic hydrocarbons and conjugated diene hydrocarbons, and partially or completely hydrogenated block copolymers of mono-alkenyl aromatic hydrocarbons and conjugated diene hydrocarbons.

Of particular utility in the practice of the present invention are block copolymers of the type A-B-A wherein each A is an independently selected mono-alkenyl aromatic hydrocarbon polymer block having an average molecular weight of from about 2,000 to about 125,000, and wherein B is a conjugated diene hydrocarbon polymer block having an average molecular weight of from about 15,000 to about 1,000,000. We prefer to use A-B-A block copolymers wherein each A is a block of repeating styrene units and B is a block of repeating 1,3-butadiene units or isoprene units. Particularly preferred are styrene/1,3-butadiene/styrene block copolymers.

Other block copolymers which can be used in the practice of this invention are those of the types A-C-B-C-A, A-B-C-A, (A-B-C)$_{2-4}$, and D-A-B-A-D; wherein A and B are as defined above, C is a random copolymer block of a conjugated diene and a mon-alkenyl aromatic hydrocarbon said block having an average molecular weight between about 2,000 and 10,000; and D is a polybutadiene block having an average molecular weight between about 1,000 and 15,000.

In addition, we can use hydrogenated block copolymers of any of the types A-B-A, A-C-B-C-A, A-B-C-A, (A-B-C)$_{2-4}$, or D-A-B-A-D as defined above.

Examples of some suitable block copolymers and hydrogenated block copolymers, and methods for preparing them, are disclosed in U.S. Pat. No. 3,231,635 to Holden et al, U.S. Pat. No. 3,265,765 to Holden et al, U.S. Pat. No. 3,333,024 to Haefele et al, U.S. Pat. No. 3,431,323 to Jones, U.S. Pat. No. 3,670,054 to De La Mare et al, and U.S. Pat. No. 3,792,127 to Gillies.

Although any random copolymer of 1,3-butadiene and acrylonitrile can be used, we prefer a copolymer having a high acrylonitrile content, i.e. an acrylonitrile content of from about 35 to about 45%. Random copolymers of 1,3-butadiene and acrylonitrile are well known, and may be prepared, by way of example, by the procedure described in "Preparative Methods of Polymer Chemistry" by Sorenson and Campbell, pages 219–20 (Interscience Publishers, Inc, New York, 1961).

The mixture of polymers comprises from about 30 to about 50% by weight of an olefin/ester copolymer, from about 15 to about 35% by weight of a thermoplastic rubber, and from about 25 to about 40% by weight of a random copolymer of 1,3-butadiene and acrylonitrile. The polymers may be in any convenient form, such as sheets, rods, crumbs or powders. Small crumbs or powders are preferred, for ease of handling and pre-blending.

In order to facilitate the release of the polymeric composition from the surfaces of processing equipment and prevent sticking thereto, and to improve flow properties during molding, small quantities of lubricants are included. The useful lubricants are those conventionally used for polymers and plastics, including for example: metal salts such as calcium stearate, calcium laurate, zinc stearate, aluminum stearate, barium stearate, cadmium stearate and other metal salts of long chain fatty acids; stearic acid, hydroxy-stearic acid, lauric acid, myristic acid, palmitic acid, and other long chain fatty acids; cetyl alcohol and other long chain fatty alcohols; and natural and synthetic waxes such as paraffin wax, microcrystalline wax, low molecular weight polyethylene, N,N'-ethylene bis(stearamide), and the like. Either a single lubricant, or a mixture of two or more, can be used. The amount of lubricant ranges from about 0.1 to about 10 parts by weight per 100 parts by weight of the combined polymer blend. Lesser quantities are ineffective, and higher quantities may adversely affect ink receptivity of the printing plate. A preferred range of lubricant is from 1.5 to 3 parts by weight per 100 parts by weight of polymers.

In a further embodiment, the composition used to prepare our novel printing plates can also include a particulate filler. The filler is optional, and if used may serve one or more of several purposes. Although the degree of hardness, flexibility, and resiliency of our printing plates can be varied, as desired, over a substantial range by varying the composition, molecular weight, and relative proportions of the three polymeric components, additional modification and control of these properties can be achieved by the inclusion of a particulate filler. Indentation hardness, flexibility, and resiliency can be modified to a large degree by the amount of filler employed, and to a lesser degree by the chemical composition and particle size of the filler, as will be obvious to those skilled in the art of compounding elastomers and plastics. In addition to modifying the physical properties of the compositions, a particulate filler may be used to modify the ink receptivity of the printing plate surface, and to lower the cost of the composition thus making it more economical.

Any of a variety of particulate fillers can be employed, including by way of example, calcium carbonate, calcium sulfate, alumina, silica, talc, clay, barytes, carbon black, wood flour, walnut shell flour, zirconia, wollastonite, asbestos, and the like. Although any of the known fillers for elastomers and plastics are suitable, we prefer to use talc. The particle size of the filler is not critical, but it should be sufficiently finely divided that a smooth surface is produced on the finished printing plate. Particle sizes ranging from 0.1 micron to 20 microns have been found satisfactory. The amount of filler can range from about 1 part to about 50 parts by weight per 100 parts by weight of total polymer, with the preferred range being from about 10 to about 20 parts. A single filler, or a mixture of two or more, may be used.

In addition to the foregoing components, minor amounts of other optional ingredients can be included in the formulation for modifying certain properties, if desired.

For example, a small quantity of an impact modifier can be included in the composition. For this purpose, we employ impact modifiers of the type conventionally used with rigid polyvinyl chloride compounds: such as acrylic polymers; terpolymers of acrylonitrile, butadiene and styrene; terpolymers of methyl methacrylate, butadiene and styrene; copolymers of butyl acrylate and methyl methacrylate; and the like. A single impact modifier, or a mixture of two or more, can be used. The effective amounts are from about 0.5 to about 5 parts by weight per 100 parts per weight of total polymers.

In some cases, in order to facilitate mixing of the composition and to improve flow during molding it is desirable to include a plasticizer. For this purpose we use chlorinated polyethylene. Chlorinated polyethylene is an effective plasticizer and is not extractable by the ketones, alcohols, and other solvents commonly used in printing inks. The amount of plasticizer can range from about 2 to about 20 parts by weight per 100 parts by weight of total polymers, with the preferred range being from about 4 to about 10 parts.

Although it is not normally necessary to employ a stabilizer, it may be prudent to do so when very high temperatures, in excess of about 280° F, are used in blending and fusing the composition. When it is desired to employ a stabilizer, we prefer epoxidized oils or other high molecular weight epoxy compounds, such as epoxidized soybean oil, epoxidized fish oil, epoxidized rapeseed oil, epoxidized linseed oil, epoxidized safflower oil, and condensates of epichlorohydrin with bisphenols. Epoxidized linseed oil is preferred. The amount of stabilizer can range from about 1 to about 10 parts by weight per 100 parts by weight of total polymers. The preferred range is from about 2 to about 6 parts.

If desired, one or more colorants can be included, for color-coding or aesthetic purposes. Any of the organic or inorganic colorants commonly used with polymeric or plastic materials can be used in amounts ranging from about 0.1 to about 10 parts, or more. Typical of these colorants are titanium dioxide, iron oxide, chrome yellow, phthalocyanine blue, phthalocyanine green, carbon black, aluminum powder, and organic pigments and dyes.

The flexible printing plates can be prepared by any convenient means, using methods and apparatus conventionally employed for mixing, fusing and forming elastomeric or plastic materials. For example, the ingredients can be blended together prior to fusing by tumbling in a container, by the use of a ribbon blender, by the use of a Henschel mixer, or by any other known means. The blend can then be fused into a homogeneous mass through the use of heat and mastication, together with the application of pressure if desired. Thus the blend can be converted into a solid homogeneous mass by the use of an extruder, an intensive mixer, a dough mixer, a two-roll mill, a Banbury, or any convenient masticating apparatus. After a homogeneous mass has been prepared, it is converted into any convenient form for subsequent molding into a printing plate. If desired, for example, it can be extruded and chopped into pellets. The pellets can then be molded against a matrix to form a printing plate. We prefer to calender the homogeneous mass into a sheet of suitable thickness, and cut it into convenient lengths and widths. The calendered sheets can then be immediately pressed against a matrix to produce a printing plate; or cooled to room temperature and stored, for conversion to printing plates later. If desired, the calendered sheet can be used as is, or it can be planished to remove minor surface imperfections, or to adjust thickness.

The composition of this invention can be converted into a printing plate by conventional means and apparatus as used for prior art rubber or thermoplastic compositions. The means comprises pressing the composition against the face of a conventional matrix, heating the composition sufficiently to cause it to flow and conform to the impression on the matrix, cooling sufficiently to retain the detail of the configuration to be printed, and separating the printing plate from the matrix.

The printing plate thus formed can be used in a flatbed press or a rotary press. Being flexible, it is especially useful for rotary press printing.

ILLUSTRATIVE EMBODIMENTS OF THE INVENTION

In order that the invention may be readily understood by those skilled in the art, certain preferred embodiments thereof are set out in the following examples. These are to be considered illustrative of the invention, and not limitative.

EXAMPLE I

The following ingredients were mixed together in a ribbon blender at room temperature until a uniform dry-blend was obtained:

|  | Parts by Weight |
|---|---|
| Copolymer of ethylene and ethyl acrylate (1) | 400 |
| Block copolymer of styrene/1,3-butadiene/styrene (2) | 200 |
| Random copolymer of 1,3-butadiene and acrylonitrile (3) | 400 |
| Zinc stearate | 10 |
| 12-Hydroxystearic acid | 10 |

Notes:
(1) Sold by Union Carbide Corp. as BAKELITE DPDA-6182: density 0.930 g/cc; melt index 1.5 g/10 min.; Vicat softening point 66° C.
(2) Sold by Shell Chemical Co. as KRATON 3204: Shore A hardness 77; sp. gr. 1.01; melt index, condition G, 24g/10 min..
(3) Sold by B. F. Goodrich Chemical Co., as HYCAR 1411: sp. gr. 1.00; Mooney viscosity 115; high acrylonitrile content The dry blend was transferred to a Banbury mixer and masticated until a compound temperature of 280° F was reached. The fused mass from the Banbury was then transferred to a two-roll mill having a roll surface temperature of 290° F, and formed into a sheet. The sheet was fed to a three-roll calendar having roll surface temperatures of 285° F, 290° F, and 300° F, and a sheet having a uniform thickness of 0.155 inch was calendered. The calendered sheet was cooled to room temperature. After cooling, the sheet was found to be strong, flexible, and resilient.

Portions of the calendered sheet were cut to suitable dimensions and formed into a flexible printing plate by compression molding it against a conventional matrix, in a hydraulic press heated to 320° F. After 4 minutes under pressure, the press was cooled while maintaining hydraulic pressure. When cooled to room temperature, the press was opened and the finished flexible printing plate was stripped from the matrix.

The printing plate thus produced was fitted to a rotary printing press, and paper was printed using conventional printing ink. The ink receptivity of the printing plate was found to be excellent, and the test printings were faithful reproductions of the original.

EXAMPLE II

The following ingredients were charged to a ribbon blender and mixed at room temperature until a uniform dry powder mix was obtained:

|  | Parts by Weight |
|---|---|
| Copolymer of ethylene and ethyl acrylate (1) | 250.0 |
| Block copolymer of styrene/1,3-butadiene/styrene (2) | 150.0 |
| Random copolymer of 1,3-butadiene and acrylonitrile (3) | 225.0 |
| Acrylic polymer impact modifier (4) | 10.0 |
| Talc | 100.0 |
| Chlorinated polyethylene (5) | 35.0 |
| Epoxidized linseed oil | 23.0 |
| Calcium stearate | 6.0 |
| Stearic acid | 5.0 |
| Ethylene bis(stearamide) | 2.0 |
| Calcium carbonate | 21.5 |
| Valencia orange | 21.5 |

Notes:
(1) BAKELITE DPDA 6182, sold by Union Carbide Corp..
(2) KRATON 3204, sold by Shell Chemical Co.
(3) HYCAR 1411, sold by B. F. Goodrich Chemical Co.
(4) Sold by Rohm & Haas Co., as ACRYLOID KM-228: sp. gr. 1.06
(5) Sold by The Dow Chemical Co. as CPE 4814: sp. gr. 1.25; melt viscosity 21; chlorine content 48%.

The dry powder was loaded into a Banbury mixer and masticated until a stock temperature of 280° F was reached. The resulting rubber-like dough was then conveyed to a heated two-roll mill having a roll-surface temperature of 290° F and held as feed stock for calendering. A strip was cut from the mill and continuously fed by conveyor belt to a four-roll inverted "L"- calender having the off-set roll at 290° F, the top roll at 300° F, the middle roll at 320° F, and the bottom roll at 300° F.

Sheets having uniform thicknesses of 0.100, 0.155, and 0.165 inch were calendered. After cooling to ambient temperature, the sheets were cut to convenient dimensions and stacked.

Flexible duplicate printing plates were prepared from the calendered sheets by compression molding against a conventional printing plate matrix at 320–330° F, and then cooling to ambient temperature.

Test printings on a conventional rotary press using a commercial printing ink gave completely satisfactory results.

After the test printings were completed, one of the flexible plates used was again molded against a different matrix to produce a different printing surface. Test printings were then made with this re-molded plate, and a faithful reproductive image of the second matrix was obtained.

EXAMPLE III

Example I was repeated, replacing the copolymer of ethylene and ethyl acrylate with an equal weight of a copolymer of ethylene and vinyl acetate, and replacing the block copolymer of styrene/1,3-butadiene/styrene with an equal weight of a styrene/isoprene/styrene block copolymer.

EXAMPLE IV

Example I was repeated, replacing the copolymer of ethylene and ethyl acrylate with an equal weight of a copolymer of hexene-1 and 2-ethyhexyl acrylate, and replacing 10 parts of zinc stearate and 10 parts of 12- hydroxystearic acid with 20 parts of microcrystalline wax.

EXAMPLE V

Following the procedure of Example I, a printing plate having the following composition was prepared:

|  | Parts by Weight |
| --- | --- |
| Copolymer of ethylene and vinyl propionate | 500 |
| Styrene/1,3-butadiene/styrene block copolymer | 250 |
| Random copolymer of 1,3-butadiene and acrylonitrile (30% acrylonitrile) | 250 |
| Silica (diatomaceous, 3 microns) | 100 |
| Cetyl alcohol | 5 |
| Calcium laurate | 5 |

EXAMPLE VI

Example I was repeated, except that the amount of ethylene/ethyl acrylate was changed from 400 parts to 300 parts, and the amount of styrene/butadiene/styrene block copolymer was changed from 200 parts to 300 parts.

The printing plates from Examples III–VI were found to be suitable for use on a rotary printing press.

We claim:

1. A thermoplastic composition of matter suitable for the production of flexible printing plates which comprises a homogeneous blend of a mixture of polymers and at least one lubricant selected from the group consisting of metal salts of fatty acids, fatty acids, fatty alcohols, and waxes; said mixture of polymers comprising from about 30 to 50% by weight of a copolymer of an alpha-olefin having from 2 to 6 carbon atoms and a monoethylenically-unsaturated ester having from 4 to 12 carbon atoms, from about 15 to 35% by weight of a block copolymer selected from the group consisting of block copolymers of a mono-alkenyl aromatic hydrocarbon and a conjugated diene hydrocarbon and hydrogenated block copolymers of a mono-alkenyl aromatic hydrocarbon and a conjugated diene hydrocarbon, and from about 25 to 40% of a random copolymer of 1,3-butadiene and acrylonitrile; and said lubricant being present in an amount from about 0.1 parts to 10 parts by weight per 100 parts by weight of polymer mixture.

2. A composition as in claim 1 wherein the copolymer of an alpha-olefin and an ethylenically-unsaturated ester is a copolymer of ethylene and ethyl acrylate, and wherein the block copolymer is a styrene/1,3-butadiene/styrene block copolymer.

3. A composition as in claim 1 wherein the copolymer of an alpha-olefin and an ethylenically-unsaturated ester is a copolymer of ethylene and ethyl acrylate, and wherein the block copolymer is a styrene/isoprene/styrene block copolymer.

4. A composition as in claim 1 which also comprises from about 1 to about 50 parts per weight of at least one particulate filler per 100 parts by weight of polymer mixture.

5. A composition as in claim 4 wherein the filler is talc.

6. A composition as in claim 4 wherein the amount of filler is from about 10 to about 20 parts.

7. A composition as in claim 2 which also comprises from about 10 to about 20 parts per weight of talc per 100 parts per weight of polymer mixture.

8. A composition as in claim 1 which also comprises, per 100 parts by weight of polymer mixture; from about 1 to about 50 parts by weight of at least one particulate filler; from about 0.5 to about 5 parts by weight of an impact modifier; from about 2 to about 20 parts by weight of chlorinated polyethylene; from about 1 to 10 parts per weight of an epoxidized oil; and from about 0.1 to about 10 parts per weight of a colorant.

9. A flexible printing plate formed by pressing the composition of claim 1 against the face of a printing matrix at an elevated temperature and cooling the composition to solidify it while in contact with the matrix.

10. A flexible printing plate formed by pressing the composition of claim 4 against the face of a printing matrix at an elevated temperature and cooling the composition to solidify while in contact with the matrix.

* * * * *